(12) United States Patent
Inami et al.

(10) Patent No.: US 7,473,314 B2
(45) Date of Patent: Jan. 6, 2009

(54) METHOD FOR GROWING SILICON SINGLE CRYSTAL

(75) Inventors: Shuichi Inami, Tokyo (JP); Nobumitsu Takase, Tokyo (JP); Yasuhiro Kogure, Tokyo (JP); Ken Hamada, Tokyo (JP); Tsuyoshi Nakamura, Tokyo (JP)

(73) Assignee: Sumco Corporation, Tokyo (JP)

( * ) Notice: Subject to any disclaimer, the term of this patent is extended or adjusted under 35 U.S.C. 154(b) by 14 days.

(21) Appl. No.: 11/390,366

(22) Filed: Mar. 28, 2006

(65) Prior Publication Data

US 2006/0283373 A1 Dec. 21, 2006

Related U.S. Application Data

(60) Provisional application No. 60/693,944, filed on Jun. 27, 2005.

(30) Foreign Application Priority Data

Jun. 20, 2005 (JP) .............................. 2005-179995

(51) Int. Cl.
*C30B 15/20* (2006.01)
(52) U.S. Cl. .............................. 117/20; 117/13; 117/19; 117/932
(58) Field of Classification Search .................. 117/13, 117/19, 20, 932
See application file for complete search history.

(56) References Cited

U.S. PATENT DOCUMENTS 6,569,535 B2  5/2003  Murakami et al.
6,663,708 B1  12/2003  Morita et al.
6,702,892 B2  3/2004  Okui et al.
6,730,580 B2  5/2004  Chen et al.
6,843,847 B1  1/2005  Iida et al.
2002/0139298 A1  10/2002  Okui et al.
2006/0225639 A1  10/2006  Ono et al.
2006/0225640 A1  10/2006  Ono et al.
2006/0249074 A1  11/2006  Sugimura et al.

FOREIGN PATENT DOCUMENTS

| JP | 03-115185 | 5/1991 |
| JP | 06-227888 | 8/1994 |
| JP | 11-189495 | 7/1999 |
| JP | 11-199385 | 7/1999 |
| JP | 2001-220289 | 8/2001 |
| KR | 2001-0090002 | 10/2001 |
| WO | 2004/083496 A1 | 9/2004 |

OTHER PUBLICATIONS

Japanese Office Action dated Mar. 7, 2006 of Appl. PCT/JP2005/022105.
Taiwanese Office Action dated Mar. 17, 2008 for Appl. No. 094131687.

*Primary Examiner*—Felisa C Hiteshew
(74) *Attorney, Agent, or Firm*—Pillsbury Winthrop Shaw Pittman, LLP

(57) ABSTRACT

A silicon single crystal is grown using the Czochralski method. During the crystal growth, a thermal stress is applied to at least a portion of the silicon single crystal. A gaseous substance containing hydrogen atoms is used as an atmospheric gas for growing the crystal.

8 Claims, 6 Drawing Sheets

METHOD FOR GROWING SILICON SINGLE CRYSTAL

BACKGROUND OF THE INVENTION

1. Field of the Invention

The present invention relates to a method for growing a silicon single crystal that is a material of silicon wafers, and more particularly, to a method for growing a silicon single crystal, which is capable of inhibiting dislocation caused by a thermal stress and enables the growth of single crystals having dislocation-free portions at satisfactory yield.

Priority is claimed on Japanese Patent Application No. 2005-179995, filed Jun. 20, 2005, and U.S. Provisional Patent Application No. 60/693,944 filed Jun. 27, 2005 the contents of which is incorporated herein by reference.

2. Description of Related Art

The Czochralski method (CZ method) is a well known crystal growth method for producing a silicon single crystal as a raw material of silicon wafers. For an effective production of silicon single crystals having desired quality with the CZ method, controlling of temperature of a silicon single crystal during the crystal growth has been known in the prior art. For example, a technique has been proposed for increasing the maximum pulling rate by quenching a vicinity of a solid-liquid interface of a silicon single crystal during the crystal pulling (see, for example, Patent Document 1: Japanese Unexamined Patent Application, First Publication No. H11-199385).

However, in the technique described in Patent Document 1, dislocations are easily generated by thermal stress caused by cooling of the silicon single crystal, resulting in a problem on poor productivity and yield.

Generally, when dislocations occur in a silicon single crystal during crystal pulling, the pulled-up silicon single crystal is molten and is pulled again to obtain a silicon single crystal having a long dislocation-free portion.

However, repeated pulling and melting of a silicon single crystal require long time for pulling, and therefore decrease productivity of crystals. If the growth of dislocation-free crystal is abandoned and the crystal growth is terminated, a large amount of silicon melt remains in the crucible. That means a waste of raw materials. In addition, volumetric expansion in the solidification process of the remaining silicon melt causes a possibility of destruction of a crucible and heater. Therefore, when dislocations occur multiple times, and pulling of a silicon single crystal having a long dislocation-free portion can not be expected even by melting the pulled-up crystal and pulling it again, a silicon single crystal generating dislocations is pulled as it is.

A silicon single crystal generating dislocation multiple times has large shear in the crystal grain, which is caused by thermal stress during the crystal growth. Therefore, after cooling the pulled-up crystal to room temperature, a large residual stress occurs due to the shear of the crystal grain. Consequently, there has been a problem of cracking of the crystal by a stress equal to or greater than the yield stress of silicon easily caused by a slight impact, for example, by an impact during taking the pulled-up single crystal out of a furnace or transporting the silicon single crystal taken out of a furnace.

In consideration of the aforementioned circumstances, the present invention provides a method for growing a silicon single crystal, which has superior productivity and is capable of inhibiting occurrence of dislocations caused by a thermal stress generated by controlling the temperature on the side surface of the silicon single crystal during crystal growth. The method allows to grow, at satisfactory yield, silicon single crystals being resistant to cracking and having long dislocation-free portions.

SUMMARY OF THE INVENTION

In order to solve the aforementioned problems, a method for growing a silicon single crystal of the present invention is a method for growing a silicon single crystal according to the Czochralski method comprising: applying a thermal stress to at least a portion of the silicon single crystal during crystal growth; and using a gaseous substance containing hydrogen atoms as an atmospheric gas for growing the crystal. In the present invention, the thermal stress applied to at least a portion of the silicon single crystal during crystal growth refers to thermal stress that is applied to at least a portion of a side surface of a body portion of the single crystal extending from a contact with the melt surface to a height of 400 mm from the melt surface.

In the aforementioned method for growing a silicon single crystal, the thermal stress may be 30 MPa or more.

In the aforementioned method for growing a silicon single crystal may be a method in which the thermal stress may be 40 MPa or more.

In the aforementioned method for growing a silicon single crystal, the gaseous substance containing hydrogen atoms may be hydrogen gas.

In the aforementioned method for growing a silicon single crystal, a hydrogen molecule partial pressure of the gaseous substance containing hydrogen atoms in the atmospheric gas may be 40 to 400 Pa.

A silicon single crystal of the present invention is produced according to the aforementioned method for growing a silicon single crystal.

The following provides an explanation of the quality (defect status) and productivity (pulling rate) of silicon single crystals produced with the CZ method.

It is well known that silicon single crystals manufactured by the CZ method include fine defects called grown-in defects. The occurrence of the grown-in defects becomes apparent during the manufacturing process of semiconductor devices. FIG. 1 is a schematic cross-sectional view for explaining a radial distribution of defects included in a silicon single crystal obtained by using the CZ method. As shown in FIG. 1, the grown-in defects of the silicon single crystal grown by the CZ method comprise void defects of about 0.1 to 0.2 μm in size, which are called infrared scattering defects or crystal originated particles (COPs), and fine dislocations having sizes on the order of 10 μm, which are called dislocation clusters.

In addition, in the silicon single crystal illustrated in FIG. 1, oxygen-induced stacking faults (OSFs) occur in the ring form region having a diameter of about two-thirds of the outer diameter of the single crystal. In a region inside an OSF developing region in which the OSFs occur, infrared scattering defects on the order of $10^5$ to $10^6$ pieces/cm$^3$ are detected (infrared scattering defect developing region). Outside of the OSF developing region, there is a region including dislocation clusters on the order of $10^3$ to $10^4$ pieces/cm$^3$ (dislocation cluster developing region).

FIG. 2 is a drawing for explaining the defect distribution status in a cross-section of a silicon single crystal grown by crystal pulling gradually decreasing its pulling rate. FIG. 1 is a cross-sectional view of a silicon single crystal grown at a pulling rate that corresponds to the rate for position A in FIG. 2.

As shown in FIG. 2, at a stage of pulling by a rapid pulling rate, a ring-shaped OSF developing region appears around the periphery of the crystal, and the inside of the OSF developing region is an infrared scattering defect developing region where a large number of infrared scattering defects occur. As the pulling rate decreases, the diameter of the OSF developing region gradually decreases, and a dislocation cluster developing region where dislocation clusters occur appears outside the OSF developing region. Finally, the OSF developing region disappears and the dislocation cluster developing region appears over the entire surface of the cross section.

Contacting the outer surface of the ring-shaped OSF developing region, an oxide precipitation promoting region (PV region) that allows the formation of oxygen precipitates (BMD: bulk microdefects) is present on the outside of the OSF developing region. An oxide precipitation inhibiting region (PI region) that does not allow oxide precipitation is present between the oxide precipitation promoting region and the dislocation cluster developing region. The oxide precipitation promoting region (PV region), oxide precipitation inhibiting region (PI region) and ring-shaped OSF developing region are all defect-free regions having extremely few grown-in defects.

Adverse effects of infrared scattering defects in a silicon single crystal is smaller than that of dislocation clusters. In addition, compared with silicon single crystal having dislocation clusters, silicon single crystals having infrared scattering defects are effectively produced with high pulling rates.

Recently, accompanying the decreasing size of integrated circuits, it is pointed out that infrared scattering defects deteriorate dielectric strength of oxide films. Thus, there is a demand for high-quality silicon single crystals composed of defect-free regions in which neither infrared scattering defects nor dislocation clusters are detected.

A silicon single crystal having a desired defect status is obtained by controlling the ratio V/G of a pulling rate V (mm/min) to a thermal gradient G (° C./mm) of the crystal in the vicinity of the solid-liquid interface.

In an example of a silicon single crystal growth explained using FIGS. 1 and 2, the silicon single crystal was grown using a hot zone structure in which temperature adjustment to control the thermal gradient G at the side surface of the silicon single crystal was not carried out. In this type of hot zone structure, a thermal gradient (Gc) at the central portion of a crystal is smaller than a thermal gradient (Ge) at the periphery of the crystal (Gc<Ge). In addition, the time during which the temperature of the silicon single crystal during crystal growth is within the range of 1000 to 800° C., or in other words the time during which the silicon single crystal passes a temperature range of 1000 to 800° C. during crystal growth, exceeds 200 minutes. Within this temperature range, OSF nuclei grow in the silicon single crystal.

A method for growing a silicon single crystal having a desired defect status by controlling a thermal gradient G of the crystal in the vicinity of the solid-liquid interface is explained with reference to exemplifying drawings.

For example, a method can be considered for growing a silicon single crystal which provides a wafer having a uniform, defect-free region over the entire wafer surface by using a hot zone structure in which a thermal gradient (Gc) at the central portion of the crystal is greater than or equal to a thermal gradient (Ge) at the outer periphery of the crystal (Gc≧Ge).

Specifically, by modifying the hot zone structure, such as by modifying the dimensions and location of the heat shield that surrounds the periphery of the single crystals immediately after solidification or using a cooling member, thermal gradient G of the crystal in the vicinity of the solid-liquid interface is controlled by adjusting the temperature on the side surface of the silicon single crystal during growth, thereby making Gc≧Ge over the temperature range between the melting point and the vicinity of 1250° C. FIG. 3 is a drawing for explaining the defect distribution status of a cross section of a silicon single crystal grown by pulling with gradually decreasing pulling rate. This single crystal is grown by using a crystal growing apparatus having a hot zone structure where a thermal gradient (Gc) at the central portion of the crystal is equal to or larger than a thermal gradient (Ge) at the periphery of the crystal (Gc≧Ge).

As shown in FIG. 3, when the crystal is grown at a pulling rate corresponding to a range of B to C shown in FIG. 3 by using the crystal growing apparatus having a hot zone structure satisfying Gc≧Ge, a thermal gradient G of the crystal in the vicinity of the solid-liquid interface is controlled, and a silicon single crystal composed of a defect-free region is grown. In addition, in the example of growing a silicon single crystal explained using FIG. 3, the pulling rate for pulling a defect-free crystal is relatively faster than that in the example shown in FIG. 2. The range of the pulling rate for pulling a defect-free crystal (range from B to C in FIG. 3) is referred to as the pulling rate margin of the defect-free crystal.

In the example of growing a silicon single crystal explained using FIG. 3, the time during which the temperature of the silicon single crystal during crystal growth is within the range of 1000 to 800° C., or in other words the time during which the silicon single crystal passes a temperature range of 1000 to 800° C. during growth, is 180 to 200 minutes. Thus, in the example of growing a silicon single crystal explained using FIG. 3, the time during which the temperature of a silicon single crystal during growth is within the range of 1000 to 800° C. is shorter than that of the example shown in FIG. 2, the growth of OSF nuclei in the silicon single crystal is inhibited, and the pulling rate margin of defect-free crystal can be increased.

However, in the example of silicon single crystal growth explained using FIG. 3, since thermal gradient G of the crystal in the vicinity of the solid-liquid interface is controlled by adjusting the temperature at the side surface of the silicon single crystal during growth, in comparison with the example shown in FIG. 2 in which the temperature is not adjusted for controlling thermal gradient G at the side surface of the silicon single crystal, larger thermal stress is loaded on the silicon single crystal during growth, thereby resulting in greater susceptibility to the occurrence of dislocation caused by the thermal stress.

More specifically, in the example shown in FIG. 2 in which temperature is not adjusted for controlling the thermal gradient G at the side surface of the silicon single crystal, the thermal stress applied to the side surface of the silicon single crystal passing through the hot zone is normally about 28 MPa and less than 30 MPa. In contrast, in the case of using a growing apparatus having a hot zone in which Gc≧Ge as in the example shown in FIG. 3, the thermal stress applied to the side surface of the crystal is 30 MPa and more, and is normally about 30 to 45 MPa. Dislocations caused by thermal stress are prominent when thermal stress reaches 30 MPa or more, and if thermal stress reaches 40 MPa or more, the silicon single crystal is susceptible to the occurrence of dislocation and cracking.

A method for growing a silicon single crystal of the present invention can be preferably used in a case in which a growing apparatus has a hot zone structure that satisfies Gc≧Ge and applies a thermal stress of 30 to 45 MPa on the side surface of the silicon single crystal during growth.

In a method for growing a silicon single crystal of the present invention, the atmospheric gas for growing the single crystal contains a gaseous substance containing hydrogen atoms, such as a mixed gas of an inert gas and a gaseous substance containing hydrogen atoms. Therefore, dislocations caused by the thermal stress can be inhibited even under conditions such that the side surface of silicon single crystal is applied with the thermal stress during growth as in the case of controlling thermal gradient G of the crystal in the vicinity of the solid-liquid interface by adjusting the temperature on the side surface of the silicon single crystal during growth. The following is the explanation.

One type of occurrence of dislocations caused by thermal stress is a slip. Generation of a slip starts from a dislocation cluster when a crystal cannot withstand the thermal stress. In the present invention, since hydrogen elements in the gaseous substance containing hydrogen atoms enter interstices of the silicon crystal lattice and cause a same effect as increasing the density of interstitial atoms of the silicon, it is possible to decrease the number of interstitial atoms incorporated into the crystals from the silicon melt during solidification process of the silicon.

Since the generation of dislocation clusters originating in interstitial atoms can be inhibited by hydrogen, it is less likely for slip originating in dislocation clusters to occur. Therefore, the occurrence of dislocation is inhibited. As a result, compared with the case using an atmospheric gas not added with hydrogen, it is possible to grow a silicon single crystal of high quality, occurring fewer dislocation, withstanding to cracking, and having a longer dislocation-free portion.

According to the present invention, it is possible to effectively inhibit the occurrence of dislocation in the crystal, even under conditions such that the side surface of the silicon single crystal during crystal growth is applied with a thermal stress of 30 MPa or more at which dislocations caused by thermal stress is apparent.

Dislocation caused by thermal stress can also be effectively inhibited even under conditions such that the side surface of a silicon single crystal during the crystal growth is applied with a thermal stress of 40 MPa or more. Conventionally, at the thermal stress of 40 MPa or more, dislocations occurred numerous times and residual stress approximate to the yield stress of silicon occurred in the silicon single crystal following growth and cooling.

In a method for growing a silicon single crystal of the present invention, as a gaseous substance containing hydrogen atoms, as well as hydrogen gas, it is possible to use one or more types of gases selected from, for example, inorganic compounds containing hydrogen atoms such as $H_2O$, $CH_4$ and HCl, hydrocarbons such as silane gas and $CH_4 \cdot C_2H_2$, and various substances containing hydrogen atoms such as alcohols and carboxylic acids.

In the case of using hydrogen gas for the gaseous substance containing hydrogen atoms, the hydrogen gas can be supplied to the pulling furnace through a dedicated line from, for example, a commercially available hydrogen tank, hydrogen gas storage tank or hydrogen tank in which hydrogen has been stored onto a hydrogen-storing alloy.

In addition, examples of inert gases (noble gases) that can be used include one or more types of a gas selected from Ar, He, Ne, Kr and Xe. An argon (Ar) gas is used normally for its moderate cost, a mixture of another inert gas such as He, Ne, Kr or Xe and Ar gas may also be used.

The concentration of oxygen gas ($O_2$) in the atmospheric gas is set so as to satisfy the equation $$\alpha - 2\beta \geq 3\% \text{ (volume \%)}$$

where $\alpha$ is the concentration of the gaseous substance containing hydrogen atoms calibrated to the concentration of hydrogen molecule and $\beta$ is the concentration of the oxygen gas ($O_2$). When the concentration $\beta$ of the oxygen gas ($O_2$) and the concentration $\alpha$ of the gaseous substance containing hydrogen atoms calibrated to the concentration of the hydrogen molecule in the atmospheric gas do not satisfy the equation, the effect for inhibiting the occurrence of grown-in defects by the hydrogen atoms captured in the silicon single crystal cannot be obtained.

FIG. 4 is a drawing for explaining the defect distribution status of a cross-section of a silicon single crystal obtained using a method for growing a silicon single crystal of the present invention. The silicon single crystal shown in FIG. 4 was grown by gradually decreasing the pulling rate during pulling using a same growing apparatus for FIG. 3, having a hot zone structure satisfying Gc≧Ge, while supplying to a pulling furnace an inert gas added with hydrogen to have a hydrogen partial pressure of 250 Pa.

In the case of using a mixed gas of inert gas and hydrogen for the atmospheric gas for growing the single crystal, since the occurrence of dislocation clusters originating in interstitial atoms is inhibited by hydrogen as previously described, the defect-free region expands to the portion of a lower pulling rate. Thus, in comparison with the example shown in FIG. 3 in which an insert gas is used for the atmospheric gas, the minimum pulling rate for pulling a defect-free crystal is decreased as shown in FIG. 4, and the range of the pulling rate for pulling the defect-free crystals (pulling rate margin of defect-free crystals (range from D to E in FIG. 4)) is enlarged.

In the subsequent cooling process, almost all of the hydrogen having an effect on the formation of grown-in defects is dissipated outside the silicon single crystals.

In the case of using a mixed gas of inert gas and hydrogen for the atmospheric gas, in a growing apparatus during growing the silicon single crystal, silicon melt contains dissolved hydrogen in an amount proportional to the partial pressure of the hydrogen contained in the inert gas atmosphere. Therefore, the hydrogen is distributed in the silicon crystal which solidifies from the silicon melt.

A concentration of hydrogen in the silicon melt depends on the partial pressure of the hydrogen in the gaseous phase. The concentration can be determined based on Henry's law and is expressed by the following equation:

$$P_{H2} = k C_{LH2}$$

where $P_{H2}$ is the partial pressure of the hydrogen in the atmosphere, $C_{LH2}$ is the hydrogen concentration of the silicon melt, and k is a coefficient between them.

On the other hand, the hydrogen concentration of the silicon single crystal is determined by the relationship between the hydrogen concentration of the silicon melt and the segregation thereof and is expressed by the following equation:

$$C_{SH2} = k' C_{LH2} = (k'/k) P_{H2}$$

where $C_{SH2}$ is the hydrogen concentration of the crystal and k' is a segregation coefficient between the hydrogen in the silicon melt and the hydrogen in the crystal.

Therefore, when a silicon single crystal is grown in the inert gas atmosphere containing hydrogen, the hydrogen in the silicon single crystal immediately after the solidification can be controlled so as to have an even and desired concentration along the axial direction of the crystal by controlling the partial pressure of the hydrogen in the atmosphere. The hydrogen partial pressure can be controlled by the hydrogen concentration and a gas pressure in the furnace.

FIG. 5 is a graph showing a relationship between the hydrogen partial pressure in the atmospheric gas and a V/G ratio. So long as the same hot zone structure is employed, a temperature distribution inside the single crystal during the crystal pulling hardly changes even when the pulling rate is changed. Therefore, the V/G ratio shown in FIG. 5 depends on the pulling rate. As shown in FIG. 5, as the hydrogen partial pressure in the atmosphere increases, pulling rate for the defect-free crystal decreases, but the pulling rate margin of the defect-free crystal increases.

The pulling rate margin of the OSF region decreases with increasing hydrogen partial pressure. The pulling rate margin of the PI region is definitely enlarged with increasing hydrogen partial pressure. Although the pulling rate of the PV region either widens or narrows as hydrogen partial pressure increases, the pulling rate margin has a large value when the hydrogen partial pressure is 100 to 250 Pa.

In a method for growing a silicon single crystal of the present invention, dislocation caused by thermal stress can be effectively inhibited by making the hydrogen molecule partial pressure of the gaseous substance containing hydrogen atoms in the atmospheric gas 40 to 400 Pa. In the case the hydrogen molecule partial pressure is less than 40 Pa, there is a possibility that sufficient effect of inhibiting occurrence of dislocation cannot be obtained. The partial pressure of hydrogen molecules exceeding 400 Pa is undesirable because such a condition increases susceptibility to the generation of large void defects referred to as hydrogen defects. In addition, by making the hydrogen molecule partial pressure in the gaseous substance containing hydrogen atoms in the atmospheric gas 400 Pa or less, even if air leaks into silicon single crystal growing apparatus, the apparatus can be operated safely without the risk of combustion.

As shown in FIG. 5, the pulling rate margin of defect-free crystals can be increased by setting the hydrogen molecule partial pressure of the gaseous substance containing hydrogen atoms in the atmospheric gas at 40 to 400 Pa. In the case the hydrogen molecule partial pressure is less than 40 Pa, sufficient effect of increasing the pulling rate margin of a defect-free crystal cannot be obtained.

As shown in FIG. 5, by setting the hydrogen molecule partial pressure of the gaseous substance containing hydrogen atoms in the atmospheric gas at 40 to 160 Pa (range of I in FIG. 5), it is possible to grow easily a silicon single crystal that provides silicon wafers having a PV region over the entire wafer surface. In the case the hydrogen molecule partial pressure exceeds 160 Pa, the PI region is easily contaminated, thereby making it difficult to grow a silicon single crystal from which silicon wafers having a PV region over their entire surface can be obtained. A PV region easily generates oxide precipitates. In the case of silicon wafers composed of a PV region, BMDs having intrinsic gettering effect are formed easily during, for example, so-called denuded zone (DZ) formation treatment of the surface.

As shown in FIG. 5, by setting the hydrogen molecule partial pressure of the gaseous substance containing hydrogen atoms in the atmospheric gas at 160 to 400 Pa (range of II in FIG. 5), it is possible to grow easily a silicon single crystal for providing silicon wafers having a PI region over their entire surface. In the case the hydrogen molecule partial pressure is less than 160 Pa, the crystal is easily contaminated with PV region. In such a case, it is difficult to grow a silicon single crystal from which silicon wafers having a PI region over their entire surface can be obtained.

A method for growing a silicon single crystal of the present invention can also be preferably used in the case for growing a silicon single crystal composed of a defect-free region using the following hot zone structure and supplying an inert gas containing hydrogen to the pulling furnace. In the hot zone structure, a ratio Gc/Ge of axial thermal gradient Gc at the central portion of the crystal over a temperature range between the melting point and 1350° C. to axial thermal gradient Ge at the periphery of the crystal over a temperature range between the melting point and 1350° C. is 1.1 to 1.4, and the axial thermal gradient Gc is 3.0 to 3.5° C./mm. In the case of using a growing apparatus having such a type of hot zone structure, 80 to 180 minutes are needed for the time during which a thermal stress of about 30 to 45 MPa is applied to the side surface of the silicon single crystal, and the temperature of the silicon single crystals during growth is within the range of 1000 to 800° C. In other words, during the time, the silicon single crystals pass a temperature range of 1000 to 800° C.

In a method for growing a silicon single crystal of the present invention, since the atmospheric gas for growing the single crystal is a mixed gas of an inert gas and a gaseous substance containing hydrogen atoms, dislocation caused by thermal stress can be effectively inhibited using a hot zone structure in which the ratio Gc/Ge of axial thermal gradient Gc at the central portion of the crystal over a temperature range between the melting point and 1350° C. to the axial thermal gradient Ge at the periphery of the crystal over a temperature range between the melting point and 1350° C. is 1.1 to 1.4, and the axial thermal gradient Gc is 3.0 to 3.5° C./mm.

FIG. 7 is a drawing for explaining the defect distribution status of a cross-section of the other silicon single crystal obtained using a method for growing a silicon single crystal of the present invention. The silicon single crystal shown in FIG. 7 is grown by using a growing apparatus having a hot zone structure, controlling thermal gradient G of the crystal in the vicinity of the solid-liquid interface by adjusting the temperature on the side surface of the silicon single crystal during growth, and gradually decreasing the pulling rate during pulling by supplying an inert gas added with hydrogen to have a hydrogen partial pressure of 240 Pa in the pulling furnace. In the hot zone structure, Gc/Ge is controlled to be 1.1 to 1.4 and the axial thermal gradient Gc is controlled to be 3.0 to 3.5° C./mm by modifying the dimensions and location of the heat shield that surrounds the periphery of the single crystal immediately after solidification, and by using a cooling member.

FIG. 6 is a drawing for explaining the defect distribution status of a cross-section of a silicon single crystal grown by using a growing apparatus having a hot zone structure similar to that of FIG. 7, controlling thermal gradient G of the crystals in the vicinity of the solid-liquid interface by adjusting the temperature on the side surface of the silicon single crystal during growth, and gradually decreasing the pulling rate during pulling while supplying only inert gas to the pulling furnace.

As shown in FIG. 7, as a result of crystal growth by the aforementioned method, the pulling rate margin of defect-free crystals (range from F to G in FIG. 6, range from F to G in FIG. 7) can be increased compared with the example shown in FIG. 6 in which an inert gas was used for the atmospheric gas. In addition, as a result of using a growing apparatus having a hot zone structure in which Gc/Ge is 1.1 to 1.4 and axial thermal gradient Gc is 3.0 to 3.5° C./mm, the thermal gradient G of the crystal in the vicinity of the solid-liquid interface can be increased, pulling rate V can be increased without altering V/G, and the minimum pulling rate for pulling a defect-free crystal can be improved. In addition, the controllability of V/G during pulling of a silicon single crystal can be improved by a crystal growth according to the aforementioned method. In addition, as shown in FIG. 7, since the pulling rate margin of the oxide precipitation promoting region (PV region) and the pulling rate margin of the oxide precipitation inhibiting region (PI region) (range from H to G in FIG. 7) are enlarged by growing a crystal according to the aforementioned method, a silicon single crystal having a PV region over the entire wafer surface, or a silicon single crystal having a PI region over the entire wafer surface can be obtained.

As shown in FIGS. 6 and 7, by using a growing apparatus having a hot zone structure in which Gc/Ge is 1.1 to 1.4 and axial thermal gradient Gc is 3.0 to 3.5° C./mm, the growth of a single crystal can be controlled so as to satisfy $$(fpD-fpR)/fpD \times 100 = \pm 20(\%)$$

where fpD is a rate for growing the portion m, as shown in FIG. 6, protruding in the axial direction of the central portion at the interface between the PV region and OSF developing region, and fpR is a rate for growing a portion n, as shown in FIG. 6, which bulges in ring form (a portion protruding in the axial direction at a midpoint between the center of the crystal and the outermost portion of the crystal in the radial direction of the crystal).

Furthermore, in the present invention, in the case the furnace internal pressure is within the range of 4 to 6.7 kPa (30 to 50 Torr), then nitrogen ($N_2$) may be present in the atmospheric gas at a concentration of 20% by volume or less. In the case the nitrogen concentration exceeds 20% by volume, there is a possibility of occurring dislocations in the silicon single crystal.

According to the present invention, a method for growing a silicon single crystal can be provided. By this method, it is possible to inhibit dislocations caused by thermal stress that occurs due to adjustment of the temperature on the side surface of the silicon single crystal during growth. Thus the method for growing silicon single crystal being resistant to cracking and having dislocation-free portion can be provided.

DETAILED DESCRIPTION OF THE INVENTION

A first embodiment according to the present invention will be described below with reference to the drawings.

Figure 1:
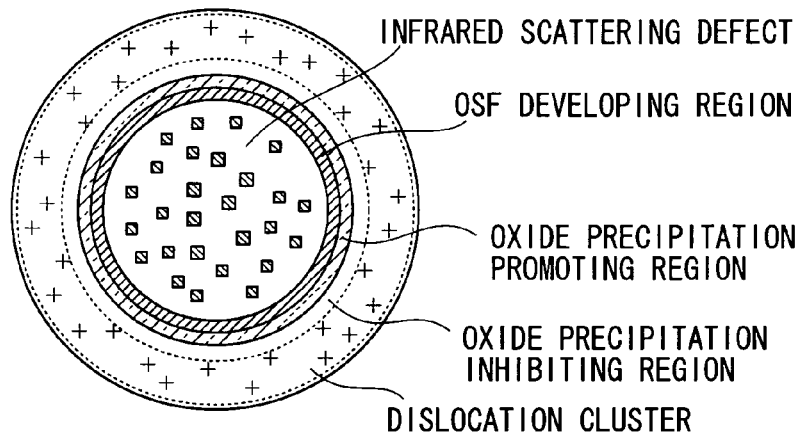
FIG. 1 is a cross-sectional view for explaining defect distribution status in the radial direction of a silicon single crystal obtained with the CZ method.
Figure 2:
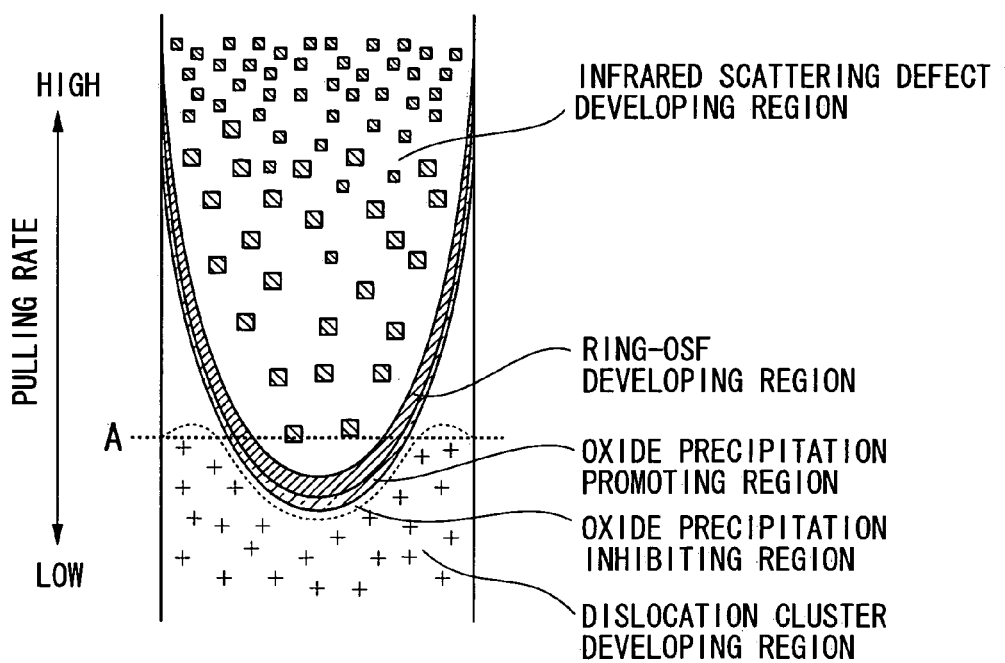
FIG. 2 is a drawing for explaining the defect distribution status of a cross-section of a silicon single crystal grown by gradually decreasing the pulling rate during pulling using a growing apparatus having a hot zone structure in which the thermal gradient (Gc) at the central portion of the crystal is smaller than the thermal gradient (Ge) at the periphery of the outer surface of the crystal (Gc<Ge).
Figure 3:
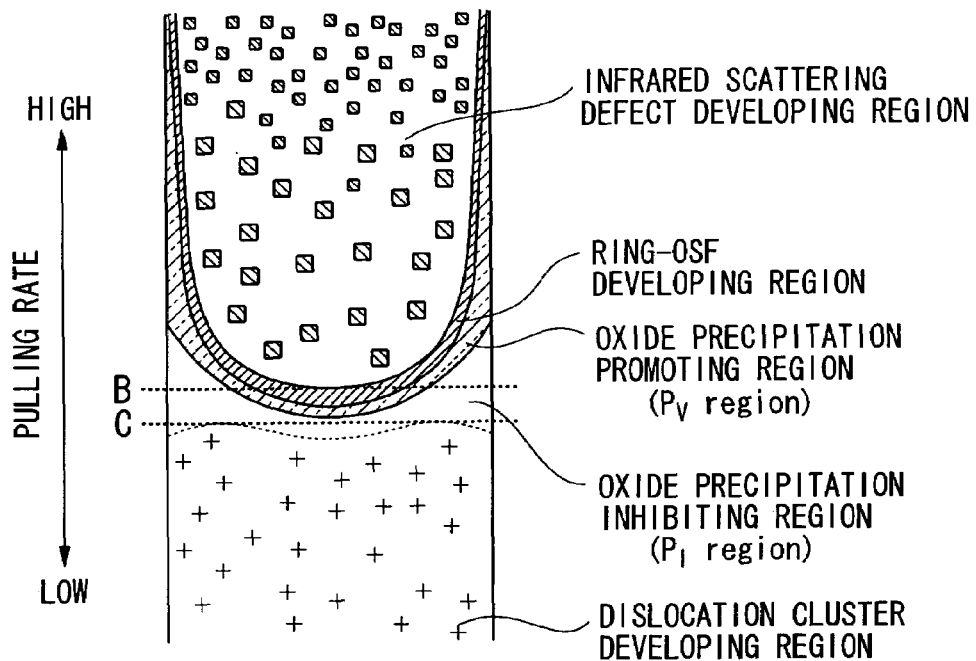
FIG. 3 is a drawing for explaining the defect distribution status of a cross-section of a silicon single crystal grown by gradually decreasing the pulling rate during pulling using a growing apparatus having a hot zone structure in which thermal gradient (Gc) at the central portion of the crystals is greater than or equal to thermal gradient (Ge) at the periphery of the crystal (Gc≧Ge).
Figure 4:
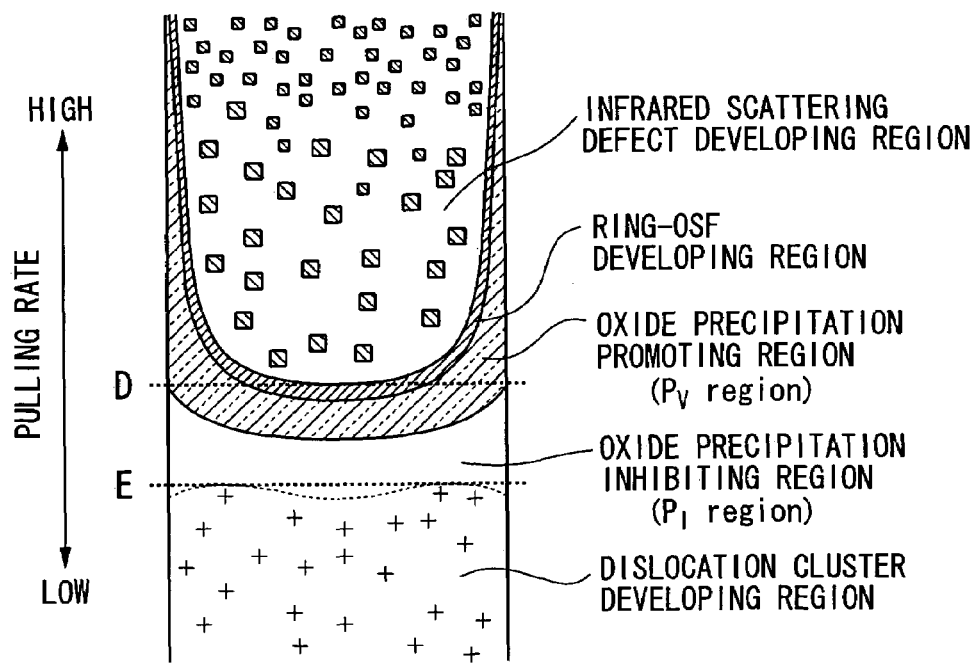
FIG. 4 is a drawing for explaining the defect distribution status of a cross-section of silicon single crystals obtained using a method for growing a silicon single crystal of the present invention.
Figure 5:
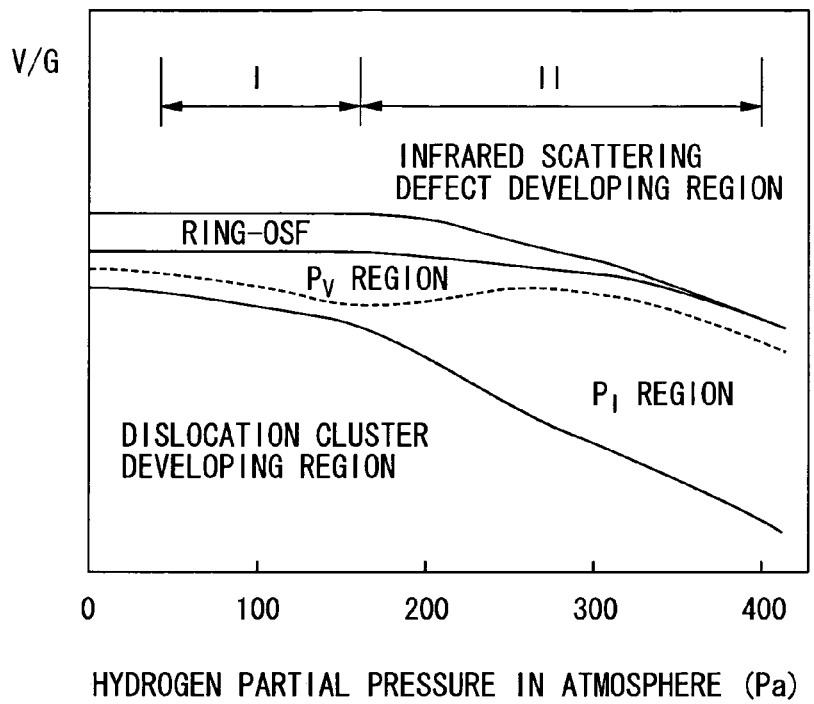
FIG. 5 is a graph showing the relationship between hydrogen partial pressure in the atmosphere and the ratio (V/G) of pulling rate to thermal gradient.
Figure 6:
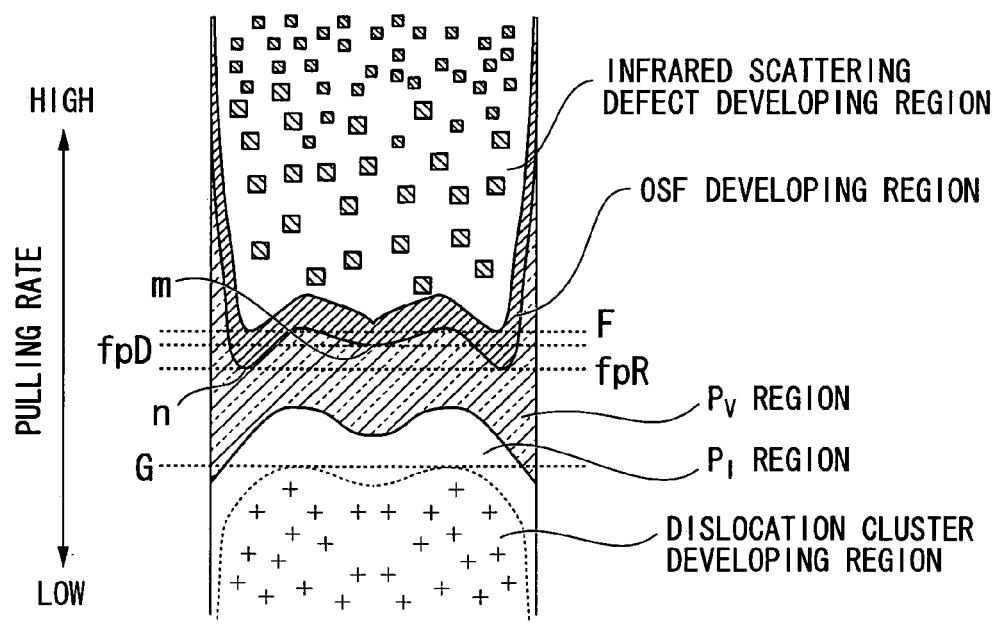
FIG. 6 is a drawing for explaining the defect distribution status of a cross-section of a silicon single crystal grown by gradually decreasing the pulling rate during pulling using a growing apparatus having a hot zone structure in which Gc/Ge is 1.1 to 1.4 and the axial thermal gradient Gc is 3.0 to 3.5° C./mm.
Figure 7:
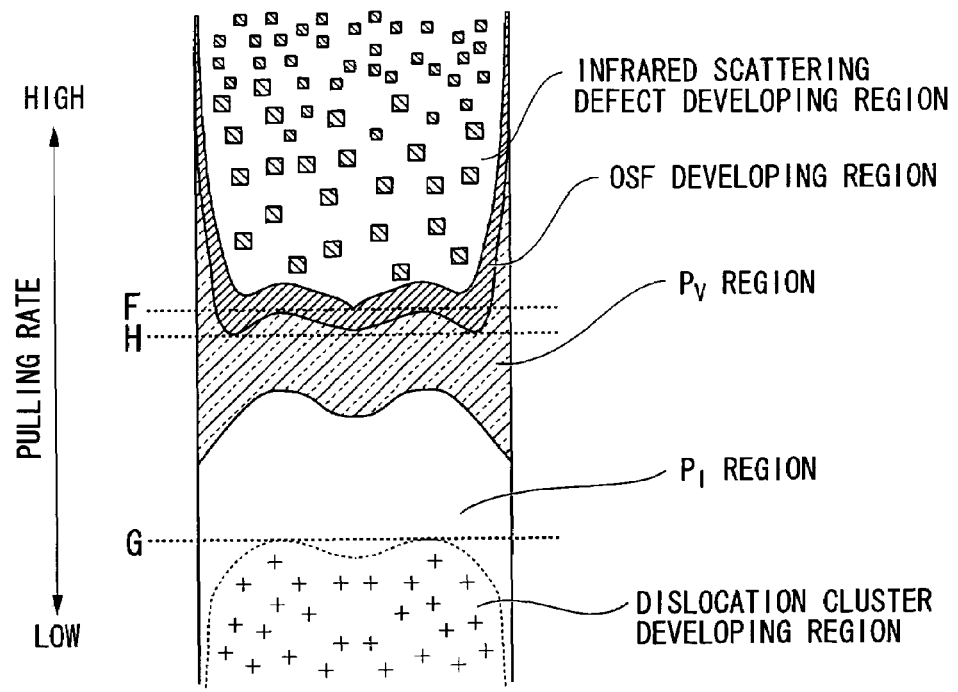
FIG. 7 is a drawing for explaining the defect distribution status of a cross-section of a silicon single crystal grown by gradually decreasing the pulling rate during pulling using a growing apparatus having a hot zone structure in which Gc/Ge is 1.1 to 1.4 and the axial thermal gradient Gc is 3.0 to 3.5° C./mm, and supplying an inert gas added with hydrogen to the pulling furnace.
Figure 8:
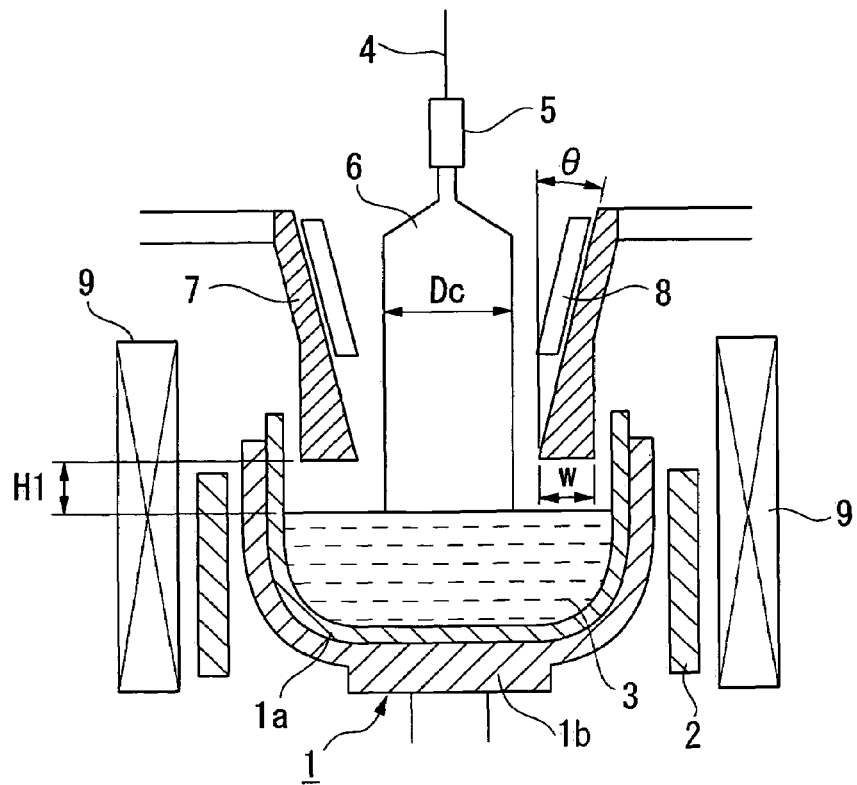
FIG. 8 is a longitudinal cross-sectional view of a CZ furnace suitable for carrying out a method for growing a silicon single crystal of the present invention.

FIG. 8 is a longitudinal sectional view of a CZ furnace suitable for carrying out a method for growing a silicon single crystal according to the embodiment.

The CZ furnace shown in FIG. 8 is provided with a crucible 1 placed at the central part of a chamber, a heater 2 placed outside the crucible 1, and a magnetic field supply unit 9 placed outside the heater 2. The crucible 1 has a dual structure, in which a quartz crucible 1a containing a silicon melt 3 inside is supported by a graphite crucible 1b placed outside the quartz crucible 1a, and is rotated and moved up and down by a support shaft called a pedestal.

Above the crucible 1, a cylindrical heat shield 7 is provided. The heat shield 7 has a structure in which its shell is made of graphite and its inside is packed with graphite felt. The inner surface of the heat shield 7 has a tapered shape in which its inner diameter gradually decreases from its upper end to its lower end. The upper outer surface of the heat shield 7 has a tapered shape which corresponds to the shape of its inner surface. The lower outer surface of the heat shield 7 is formed to be almost straight cylindrical surface in such a way that the thickness of the heat shield 7 gradually increases downward.

The CZ furnace has a hot zone structure which realizes a ratio Gc/Ge of 1.1 to 1.4, and preferably 1.2 to 1.4, where Gc is an axial thermal gradient at a central portion of a crystal between its melting point and 1350° C., and Ge is an axial thermal gradient at a periphery of the crystal between its melting point and 1350° C. The hot zone structure also realizes a thermal gradient Gc of 3.0 to 3.5° C./mm and preferably 3.2 to 3.3° C./mm. A time during which the temperature of the silicon single crystal during the crystal growth is in the range of 1000° C. to 800° C., that is to say, a time period during which the silicon single crystal during the crystal growth passes the temperature range of 1000° C. to 800° C. is 80 to 180 minutes and preferably 100 to 150 minutes. Such a hot zone structure comprises the heat shield 7 and a water cooling unit 8.

Since the heat shield 7 is used to intercept radiant heat which radiates from the heater 2 and the surface of the silicon melt 3 to the side surface of a silicon single crystal 6, the heat shield 7 surrounds the side surface of the silicon single crystal 6 during the crystal growth and the surface of the silicon melt 3. The following is an example of a structural requirement of the heat shield 7.

The width W in the radial direction is, for example, 50 mm, inclination θ of the inner surface in the shape of an inverted circular cone relative to the vertical direction is, for example, 21°, and height H1 from the melt surface at the lower end of heat shield 7 is, for example, 60 mm.

A water cooling unit 8 is attached to the inside of heat shield 7. As a result of attaching the water cooling unit 8 to the inside of the heat shield 7, in addition to be able to cool the side surface of silicon single crystal 6 efficiently, precipitation of SiO into the water cooling unit 8 is inhibited by the flow of inert gas descending at a high rate down the inside of heat shield 7.

Examples of the water cooling unit 8 used here include a coiled water pipe made of copper or stainless steel, and a water cooling jacket having a partition wall through which water flows. The flow rate of water in the water cooling unit 8 is preferably 10 liters/minute or more. The cooling capacity of water cooling unit 8 can be adjusted by adjusting the height of the water cooling unit 8 in the direction of crystal pulling or by adjusting the installed distance from the melt surface. The structure of the water pipe or water cooling jacket can be suitably altered according to the flow rate. In addition, by adjusting the cooling capacity of the water cooling unit 8, together with changing the thermal stress applied to the side surface of the silicon single crystal during crystal growth within the range of 30 to 45 MPa, the time during which the silicon single crystal during growth has a temperature within the range of 1000 to 800° C. is changed within the range of 80 to 180 minutes.

Where a diameter of a pulled-up single crystal is defined as Dc, the cooling member of the water cooling unit 8 is typically designed so that the diameter of the inner peripheral surface is 1.20 Dc to 2.50 Dc, the length is 0.25 Dc or more, and the distance from the melt surface to the lower end of the cooling member is within the range of 0.30 Dc to 0.85 Dc.

In addition, the intensity of the magnetic field supplied from the magnetic field supply unit 9 in terms of the horizontal magnetic field (transverse magnetic field) is 2000 to 4000 G, and more preferably 2500 to 3500 G, while the central height of the magnetic field relative to the liquid surface of the melt is set to be within the range of −150 to +100 mm, and more preferably −75 to +50 mm.

In addition, in terms of the cusp magnetic field, the intensity of the magnetic field supplied from the magnetic field supply unit 9 is 200 to 1000 G, and more preferably 300 to 700 G, while the central height of the magnetic field relative to the liquid surface of the melt is set to be within the range of −100 to +100 mm, and more preferably −50 to +50 mm.

As a result of supplying the magnetic field from the magnetic field supply unit 9 at the aforementioned magnetic field intensity and within the aforementioned range of the central height of the magnetic field, convection can be inhibited so that the status of the solid-liquid interface is preferable.

In the case of pulling the silicon single crystals 6 using the CZ furnace shown in FIG. 8, the axial thermal gradient Gc at the central portion of the crystals between the melting point and 1350° C. is 3.0 to 3.2° C./mm, the axial thermal gradient Ge at the periphery of the crystal is 2.3 to 2.5° C./mm, and the ratio of Gc/Ge is about 1.3. In addition, the thermal stress which is applied to the side surface of the silicon single crystal during crystal growth is 30 to 45 MPa. This state hardly changes at all even if the pulling rate is changed.

Next, an explanation is provided of a method for growing a silicon single crystal 6 using the CZ furnace shown in FIG. 8, and a mixed gas of inert gas and hydrogen gas for the atmospheric gas for growing the single crystal.

[Setting of Operating Conditions]

First, the operating conditions for growing a silicon single crystal of a target defect status is set. An explanation is provided of a method for setting operating conditions for growing a defect-free crystal as an example of setting operating conditions. First, in order to determine the allowable range of hydrogen concentration and pulling rate that allows the obtaining of defect-free crystals, single crystals are grown having a target diameter of, for example, 300 mm under respective conditions by setting the hydrogen molecule partial pressure in the atmospheric gas to mixing ratios of, for example, 0, 20, 40, 160, 240 and 400 Pa.

For example, 300 Kg of polycrystalline silicon of high-purity is loaded into the crucible, and p-type (such as B, Al or Ga) or n-type (such as P, As or Sb) dopant is added so that the electrical resistivity of the single crystal reaches a desired value such as 10 Ωcm. The inside of the apparatus is then replaced with an argon atmosphere and pressure is reduced to 1.33 to 26.7 kPa (10 to 200 Torr) and allowed to flow into the furnace by setting so that the hydrogen molecule partial pressure in the atmospheric gas reaches the aforementioned predetermined mixing ratio.

Next, together with supplying a horizontal magnetic field of, for example, 3000 G from magnetic field supply unit 9 so that the central height of the magnetic field is −75 to +50 mm relative to the liquid surface of the melt, the polycrystalline silicon is heated by heater 2 to form a silicon melt 3. A seed crystal attached to a seed chuck 5 is immersed in silicon melt 3 and the crystal is pulled while rotating crucible 1 and pulling shaft 4. The crystal has an orientation of {100}, {111} or {110}. A seed drawing is conducted to obtain a crystal having no dislocation, and then a shoulder portion is formed, after which the other shoulder portion is formed to give a target body diameter.

When the body length of the crystal has reached, for example, 300 mm, pulling rate of the crystal is controlled to be sufficiently higher than its critical rate, for example, 1.0 mm/min, following which the pulling rate is decreased almost linearly in accordance with the length of the pulled-up crystal. When the body length has reached, for example, 600 mm, the pulling rate is decreased so as to be lower than the critical rate (for example, 0.3 mm/min), after which the body portion is grown so as to reach a length of, for example, 1600 mm at such a pulling rate. And then, the crystal is subjected to tail drawing under normal conditions, following which the growth of the crystal is finished.

The single crystals thus grown by using the various hydrogen concentrations are cut longitudinally along the pulling axes to produce platy test specimens including portions near the pulling axes, and then the specimens are subjected to Cu decoration to observe the distribution of grown-in defects. First, each test specimen is immersed in aqueous copper sulfate solution and then air-dried followed by heat treatment at 900° C. for about 20 minutes in a nitrogen atmosphere. Subsequently, the specimen is immersed in a mixed solution of HF and HNO$_3$ to remove the copper silicide layer on the surface of the test piece and after etching the surface layer to a depth of several tens of microns, the location of the OSF ring and the distribution of each defect region is investigated by X-ray topography. In addition, the COP density of this sliced specimen is investigated by a method such as OPP method, while the density of the dislocation cluster is investigated by a method such as Secco etching method.

The relationships between hydrogen concentration and the V/G ratio of each defect region, consisting of an infrared scattering defect developing region, OSF developing region, PV region, PI region and dislocation cluster developing region, are obtained by carrying out this type of pulling experiment. By carrying out the experiment while changing pulling rate for several different axial portions such as 300 mm to 600 mm, 500 mm to 800 mm, and 700 mm to 1000 mm, the relationship between the pulling rate margin and axial location in the silicon single crystals having a target defect status can be determined

[Growth of Silicon Single Crystals]

Next, silicon single crystals 6, in which the body has a defect-free region that does not contain grown-in defects, are grown under suitable operating conditions set in accordance with the method described above using the CZ furnace shown in FIG. 8 and using a mixed gas of inert gas and hydrogen gas for the atmospheric gas for growing the single crystals.

According to a method for growing a silicon single crystal of the present embodiment, since a mixed gas of inert gas and hydrogen gas is used for the atmospheric gas for growing the single crystal, dislocation caused by thermal stress can be effectively inhibited even in the case of using a growing apparatus having a hot zone structure in which the side surface of the silicon single crystal is subjected to thermal stress of 30 to 45 MPa during growth.

The aforementioned embodiment was explained using a case in which the side surface of the silicon single crystal was applied with a thermal stress of 30 to 45 MPa during growth. However, the present invention is not limited only to the case in which side surface of a silicon single crystal during growth is applied with a thermal stress of 30 MPa or more, at which occurrence of dislocations caused by the thermal stress is apparent, but the effect of inhibiting occurrence of dislocation caused by thermal stress is obtained also in a case in which the silicon single crystal is subjected to thermal stress of less than 30 MPa.

The aforementioned embodiment was explained using as an example a method for growing a silicon single crystal 6 in which the body portion comprises a defect-free region that does not contain grown-in defects, the present invention is not limited to a method for growing a defect-free crystal, but can also be used as a method for growing a silicon single crystal of a desired defect status.

EXAMPLES

The following experiment was carried out to verify the present invention.

Namely, defect-free silicon single crystals having an outer diameter of 300 mm and body length of 1800 mm were grown using growing apparatus having hot zone structures 1 to 3 shown in Table 1 and described below, and using argon gas or a mixed gas of argon gas and hydrogen gas for the atmospheric gas.

TABLE 1

| Hot Zone Structure | Thermal Stress Acting on Side Surface of Crystals (Mpa) |
|---|---|
| 1 | 40 |
| 2 | 35.7 |
| 3 | 28 |

[Hot Zone Structure 1]

Using the CZ furnace shown in FIG. 8, a hot zone structure was prepared in which the axial thermal gradient Gc at the central portion of the crystal over a temperature range between the melting point and 1350° C. was 3.2° C./mm, the axial thermal gradient at the outer surface of the crystal was 2.2° C./mm, and the ratio of Gc/Ge was 1.3. Cooling capacity was obtained by installing the water cooling unit 8 such that the dimensions consisting of an inner diameter of 600 mm, height of 200 mm and distance from the lower surface to the liquid surface of the melt of 150 mm. A horizontal magnetic field of 3000 G was supplied from magnetic field supply unit 9 so that the central height of the magnetic field was 0 mm relative to the liquid surface of the melt.

[Hot Zone Structure 2]

Using the CZ furnace shown in FIG. 8, a hot zone structure was prepared in which the axial thermal gradient Gc at the central portion of the crystals over a temperature range between the melting point and 1350° C. was 3.0° C./mm, the axial thermal gradient at the periphery of the crystals was 2.5° C./mm, and the ratio of Gc/Ge was 1.2. The CZ furnace shown in FIG. 8 was used. Cooling capacity was obtained by installing water cooling unit 8 such that the dimensions consisted of an inner diameter of 600 mm, height of 150 mm and distance from the lower surface to the liquid surface of the melt of 200 mm. A horizontal magnetic field was supplied in the same manner as Hot Zone Structure 1.

[Hot Zone Structure 3]

Using a CZ furnace not equipped with water cooling unit 8 and heat shield 7, a hot zone structure was prepared in which the axial thermal gradient Gc at the central portion of the crystal over a temperature range between the melting point and 1350° C. was 2.8° C./mm, the axial thermal gradient at the outer surface of the crystal was 2.5° C./mm, and the ratio of Gc/Ge was 1.1. A horizontal magnetic field was supplied in the same manner as Hot Zone Structure 1.

According to the method described below, the thermal stress to which the side surfaces of the silicon single crystals were subjected during growth in the case of growing silicon single crystals using a growing apparatus having the hot zone structures of 1 to 3 was determined.

<Calculation of Heat Transfer>

Figure 9:
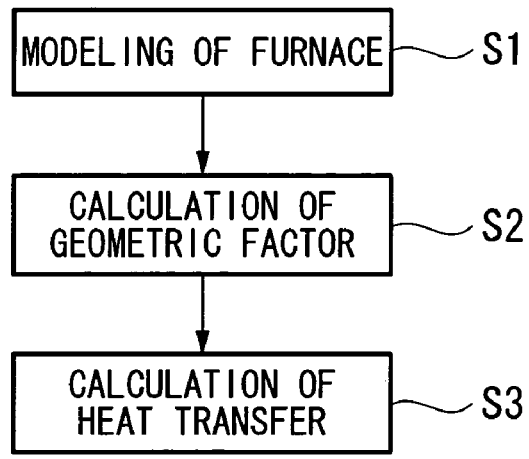
FIG. 9 is a flow chart for explaining the method of calculating heat transfer.

Thermal stress was determined using the results of heat transfer calculation shown in FIG. 9.

In the calculation of heat transfer, modeling of the pulling furnace was carried out (S1). In modeling the pulling furnace, digitizing of shapes to digitize the external shape and mesh shape, and stetting of physical properties of the material for setting thermal conductivity and surface emission rate corresponding to the material were carried out.

Next, a calculation of a geometric factors (S2) was carried out. The geometric factors represent the manner in which two surface elements are mutually seen. Calculation of geometric factors was carried out for each surface element.

Next, heat transfer was calculated (S3). In the calculation of heat transfer, calculations were made repeatedly using the SOR method to determine the emitted heat transfer and calculate convergence based on heat balance.

Calculation of convergence based on heat balance was carried out as indicated below on the condition that the pulling rate is stable within the set range.

1. Following completion of nth calculation of heat transfer, Hla is determined so as to satisfy the equation Hso=Hla+Hlq, where Hso is the heat flow rate within the silicon single crystal, Hla is the latent heat of solidification generated at the solid-liquid interface, and Hlq is the heat flow rate within the silicon melt. Since Hla is a function of the pulling rate, the determined pulling rate satisfies heat balance.

2. If the pulling rate is faster than the convergence target, the calorific value of the heater is increased, while if it is slower than the convergence target, the calorific value of the heater is decreased.
3. The n+1th calculation of heat transfer is then carried out.

<Calculation of Thermal Stress>

Figure 10:
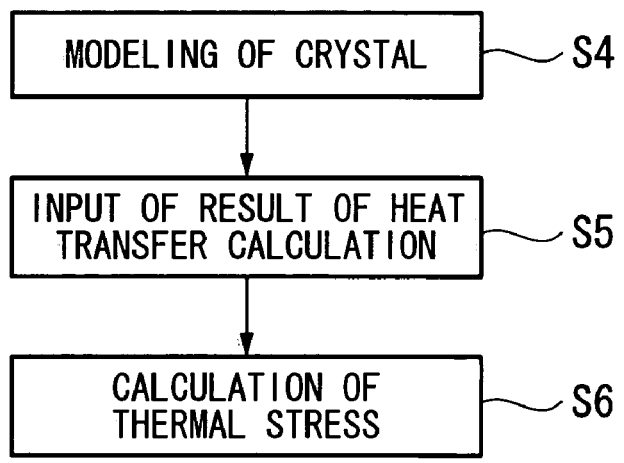
FIG. 10 is a flow chart for explaining the method of calculating thermal stress.

Thermal stress was calculated as shown in FIG. 10. First, crystal modeling (S4) was carried out. In crystal modeling, digitizing of shapes to digitize the external shape and mesh shape of the silicon single crystals, and setting of physical properties of the silicon single crystal, consisting of thermal expansion coefficient, Young's modulus and Poisson's ratio, were carried out.

Next, temperature distribution was input (S5) by inputting the result of heat transfer calculation.

Subsequently, the thermal stress in the crystals was calculated (S6) by calculating thermal stress using the finite element method.

As results of the above-described calculation, thermal stress applied on the side surface of silicon single crystals during growth in the case of crystal growth using a growing apparatus having hot zone structures 1 to 3 are shown in Table 1.

Example 1

A defect-free silicon single crystal was grown under operating conditions set according to the previously described method using a growing apparatus having Hot Zone Structure 1 shown in Table 1, and using a mixed gas consisting of hydrogen gas mixed into argon gas to have hydrogen molecular partial pressure of 240 Pa for the atmospheric gas for growing the single crystal.

Example 2

A defect-free silicon single crystal was grown using a growing apparatus having Hot Zone Structure 3 shown in Table 1 and using argon gas for the atmospheric gas for growing the single crystal.

Example 3

A defect-free silicon single crystal was grown using a growing apparatus having Hot Zone Structure 2 shown in Table 1 and using argon gas for the atmospheric gas for growing the single crystal.

Example 4 (Comparative Example)

A defect-free silicon single crystal was grown under operating conditions set according to the previously described method using a growing apparatus having Hot Zone Structure 1 shown in Table 1 and using argon gas for the atmospheric gas for growing the single crystal.

Example 5

A defect-free silicon single crystal was grown under operating conditions set according to the previously described method using a growing apparatus having Hot Zone Structure 3 shown in Table 1, and using a mixed gas consisting of hydrogen gas mixed into argon gas to have molecular partial pressure of 240 Pa for the atmospheric gas for growing the single crystal.

The pulling rates (mm/min) and pulling rate margins of defect-free crystals (mm/min) of the silicon single crystals of Examples 1 to 5 obtained in this manner are shown in Table 2.

TABLE 2

| Example | Pulling rate | Pulling rate margin | Absence of dislocation | Cracking |
|---------|--------------|---------------------|------------------------|----------|
| 1 | 0.51 | 0.043 | A | A |
| 2 | 0.42 | 0.015 | A | A |
| 3 | 0.534 | 0.027 | B | B |
| 4 | 0.55 | 0.03 | C | C |
| 5 | 0.4 | 0.023 | A | A |

A plurality of silicon single crystals were grown for each of Examples 1 to 5 and were used as test samples. Then, frequency of occurrence of dislocations during growth per single pulling experiment was determined in the manner indicated below.

If dislocations occur in a crystal after pulling the crystal to a length longer than 1000 mm, such a crystal is molten to retry pulling of a dislocation-free crystal. After repeating such operations, for a case in which a crystal free of defects throughout the entire length was obtained, frequency of melting the crystal was regarded as a frequency of occurrence of dislocations. In the case in which a crystal generating dislocations at a portion longer than 1000 mm, frequency of melting the pulled crystal plus 1 was regarded as the frequency of occurrence of dislocations.

Figure 11:
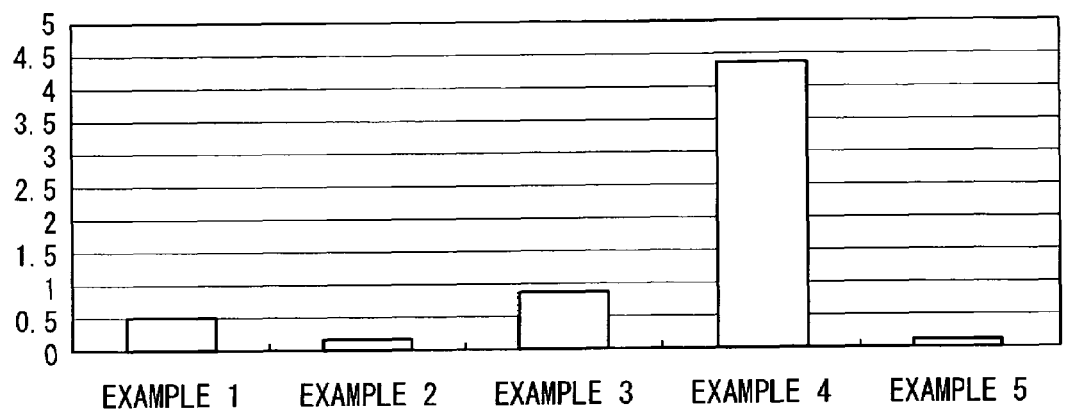
FIG. 11 is a graph showing the frequency of occurring dislocations for each example.

The average values of the results of Examples 1 to 4 are shown in FIG. 11.

Figure 12:
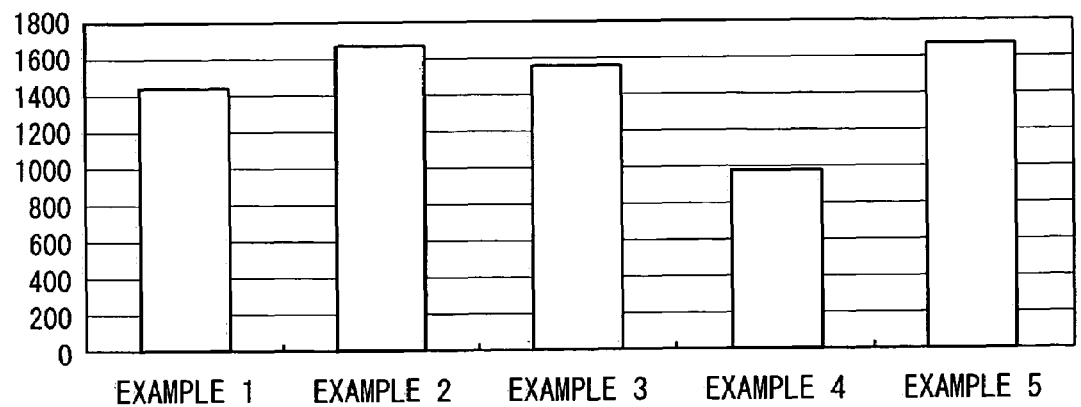
FIG. 12 is a graph showing the length of the dislocation-free portion for each example.

A plurality of silicon single crystals were grown for each of Examples 1 to 5. After growing the each crystal, length of the dislocation-free portion was examined. Average values for Examples 1 to 4 are shown in FIG. 12.

The status of dislocation-free property of the silicon single crystals of Examples 1 to 5 was evaluated depending on the following criteria. Those results are shown in Table 2.

A: The average length of the dislocation-free portion exceeds 1400 mm, and the average frequency of occurring dislocations is less than 0.5.

B: The average length of the dislocation-free portion is within the range of 1000 to 1400 mm, and the average frequency of occurring dislocations is within the range of 0.5 to 1.

C: The average length of the dislocation-free portion is less than 1000 mm, and the average frequency of occurring dislocations exceeds 1.

For the silicon single crystals of Examples 1 to 5 containing at least a portion of dislocation bearing region, the presence of cracking resulting from removing the silicon single crystals from the furnace and transporting the silicon single crystals that had been removed from the furnace was evaluated based on the following criteria. The results are shown in Table 2.

A: No cracking in any of the samples.
B: There was cracking in some of the samples.
C: There was cracking in all the samples.

According to Table 2, Example 1 as an embodiment of the present invention in which thermal stress was 40 MPa (Hot Zone Structure 1), and Example 5, in which thermal stress was 28 MPa (Hot Zone Structure 3) were evaluated as A with respect to dislocation-free property and cracking.

Example 4 as a comparative example of the present invention, was differed from Example 1 only with respect to not adding hydrogen to the atmospheric gas. The Example 4 in which thermal stress was 40 MPa (Hot Zone Structure 1), was evaluated as C with respect to dislocation-free property and cracking. Accordingly, it was confirmed that it was possible to improve dislocation-free property by adding hydrogen to the atmospheric gas, and possible to grow a silicon single crystal having fewer dislocation and longer dislocation-free length compared with the case using an atmospheric gas not containing hydrogen.

According to Table 2, Example 3 using Hot Zone Structure 2 generating thermal stress of 35.7 MPa, was evaluated as B with respect to the dislocation-free property and cracking despite being subjected to less thermal stress than Example 1.

According to Table 2, the pulling rate of Example 1 was extremely faster than those of Examples 2 and 5. The pulling rate was slower than, but stand comparison with those of Examples 3 and 4. The pulling rate of Example 5 was slower than, but standed comparison with that of Example 2.

In addition, according to Table 2, the pulling rate margin of Example 1 was extremely wide compared with Example 2, and was also wider than those of Examples 3 and 5. The pulling rate margin of Example 5 was extremely wider than that of Example 2.

According to FIG. 11, Example 1 was confirmed to show extremely fewer frequency of occurring dislocation than that of Experiment Example 4.

In addition, the results also demonstrated that Example 1 showed fewer frequency of occurring dislocation than that of Example 3 applied with thermal stress of 35.7 MPa (Hot Zone Structure 2). The frequency of occurring dislocation in Example 1 was greater than, but stood comparison with that in Example 2 generating thermal stress of 28 MPa (Hot Zone Structure 3).

Accordingly, Example 1 was confirmed to allow the growth of silicon single crystals having a frequency of occurring dislocation that was equal to the case applied with thermal stress less than 30 MPa.

According to FIG. 12, the length of the dislocation-free portion of Experiment 1 was 400 mm or more longer than that of Experiment 4. Accordingly, it was confirmed that it was possible to grow a silicon single crystal having a long dislocation-free portion by adding hydrogen to the atmospheric gas.

According to FIG. 12, the length of the dislocation-free portion of Example 1 was shorter than those of Examples 2 and 3, but the difference in the length of the dislocation-free portions was less than 250 mm. This difference is smaller than the difference of the length of dislocation free portions between Examples 1 and 4.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method for growing a silicon single crystal according to the Czochralski method, comprising:
applying a thermal stress to at least a portion of the silicon single crystal during crystal growth, and
using a gaseous substance containing hydrogen atoms as an atmospheric gas for growing the crystal,
wherein the thermal stress comprises 30 MPa or more.

2. The method for growing a silicon single crystal according to claim 1, wherein the thermal stress comprises 40 MPa or more.

3. The method for growing a silicon single crystal according to claim 1, wherein the gaseous substance containing hydrogen atoms is hydrogen gas.

4. The method for growing a silicon single crystal according to claim 1, wherein a partial pressure of hydrogen molecules in the gaseous substance containing hydrogen atoms in the atmospheric gas is 40 to 400 Pa.

5. The method for growing a silicon single crystal according to claim 1, wherein an axial thermal gradient Gc at a central portion of a crystal between its melting point and 1350° C. is controlled within a range from 3.2 to 3.3° C./mm.

6. The method for growing a silicon single crystal according to claim 1, wherein the thermal stress is controlled within a range from 30 to 45 MPa.

7. The method for growing a silicon single crystal according to claim 1, wherein a time during which the silicon single crystal pass a temperature range of 1000 to 800° C. during growth is 180 to 200 minutes.

8. The method for growing a silicon single crystal according to claim 1, wherein concentration of oxygen and hydrogen in the atmosphere satisfies an equation, $$á - 2â \geq 3\% \text{ by volume,}$$

where á is a concentration of gaseous substance containing hydrogen atoms calibrated to the concentration of hydrogen molecule, and â is a concentration of oxygen gas.

* * * * *